United States Patent [19]

Shakun et al.

[11] Patent Number: 4,734,139
[45] Date of Patent: Mar. 29, 1988

[54] THERMOELECTRIC GENERATOR

[75] Inventors: Wallace Shakun, Atlanta; John H. Bearden, Marietta; David R. Henderson, Conyers, all of Ga.

[73] Assignee: Omnimax Energy Corp., Philadelphia, Pa.

[21] Appl. No.: 820,047

[22] Filed: Jan. 21, 1986

[51] Int. Cl.[4] .............................................. H01L 35/28
[52] U.S. Cl. ..................... 136/210; 136/205; 136/208; 136/209
[58] Field of Search ......................... 136/205–212, 136/224–227; 62/3; 310/306; 322/2 R

[56] References Cited

U.S. PATENT DOCUMENTS

| 3,294,585 | 12/1966 | Senderoff | 136/205 |
| 3,351,498 | 11/1967 | Shinn et al. | 136/205 |
| 3,508,974 | 4/1970 | Bressler | 136/205 |
| 3,870,568 | 3/1975 | Oesterhelt et al. | 136/205 |
| 4,125,122 | 11/1978 | Stachurski | 136/210 |
| 4,306,426 | 12/1981 | Berthet et al. | 136/210 |

Primary Examiner—Barry S. Richman
Assistant Examiner—T. J. Wallen
Attorney, Agent, or Firm—Seidel, Gonda, Goldhammer & Abbott

[57] ABSTRACT

A thermoelectric generator module which is formed with a hot side heat exchanger having extruded fins on one surface and in contact with a series of individual thermoelectric semiconductor modules on the opposite side of the exchanger. A cold side heat exchanger attached to the opposite side of the semiconductor modules from the hot side heat exchanger, producing a thermal gradient across the semiconductor modules. The semiconductor modules are placed in an arranged pattern so that a maximum of heat flow through the modules is produced. Each semiconductor module is connected electrically to each other so that their output may be combined to produce a large quantity of electric power. A series of generator modules may be interconnected in a series or parallel combination to form a thermoelectric generator of varying power output.

14 Claims, 12 Drawing Figures

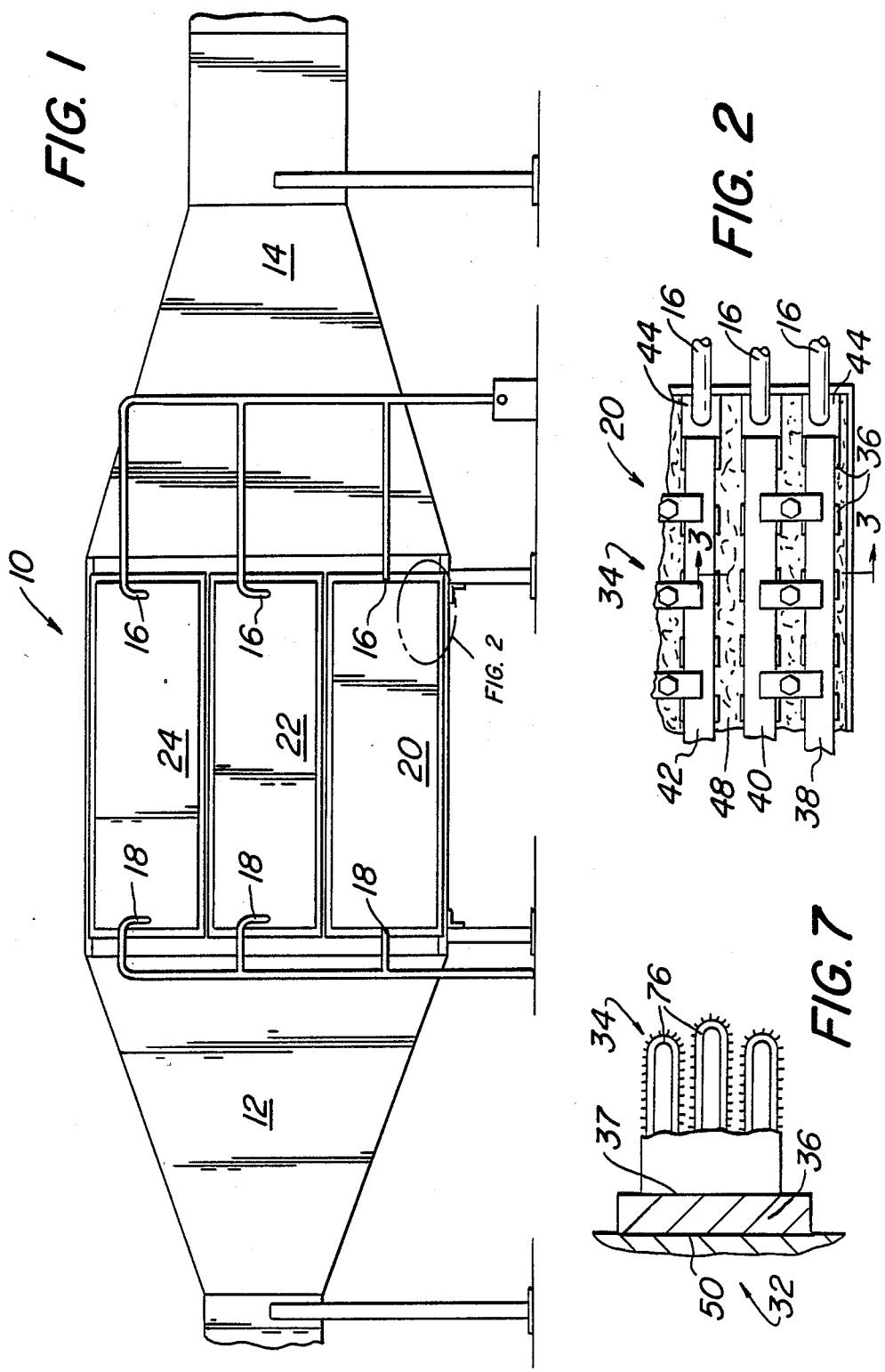

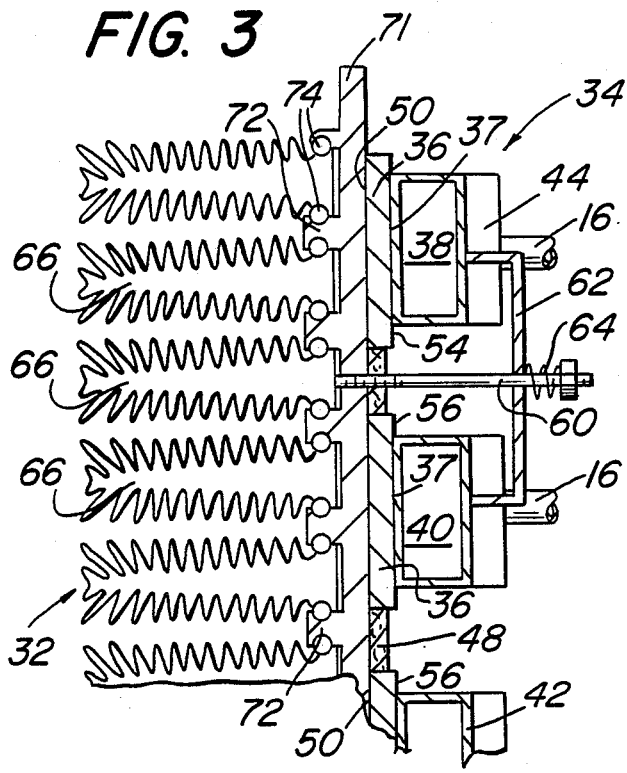
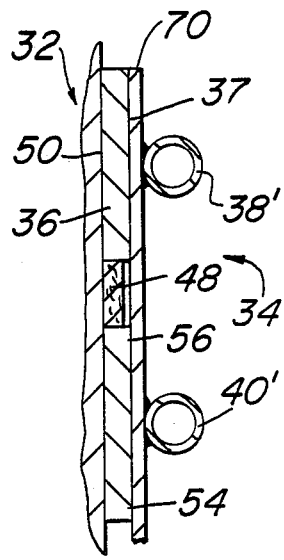
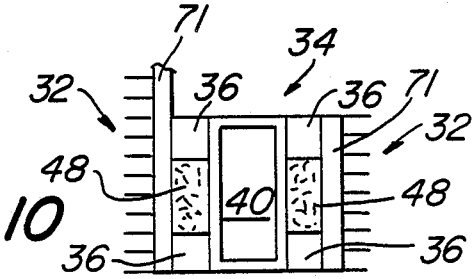
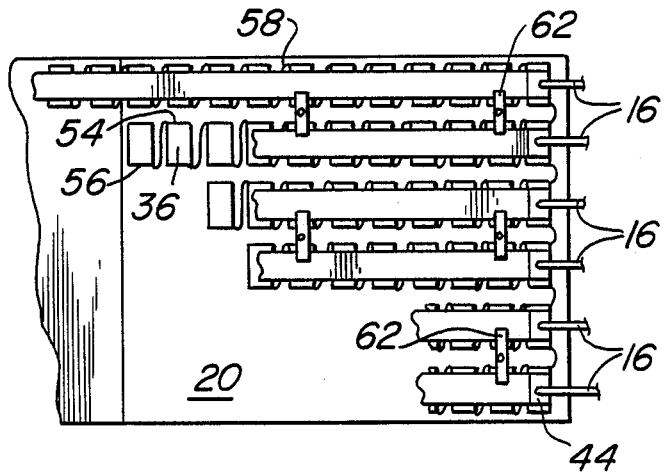

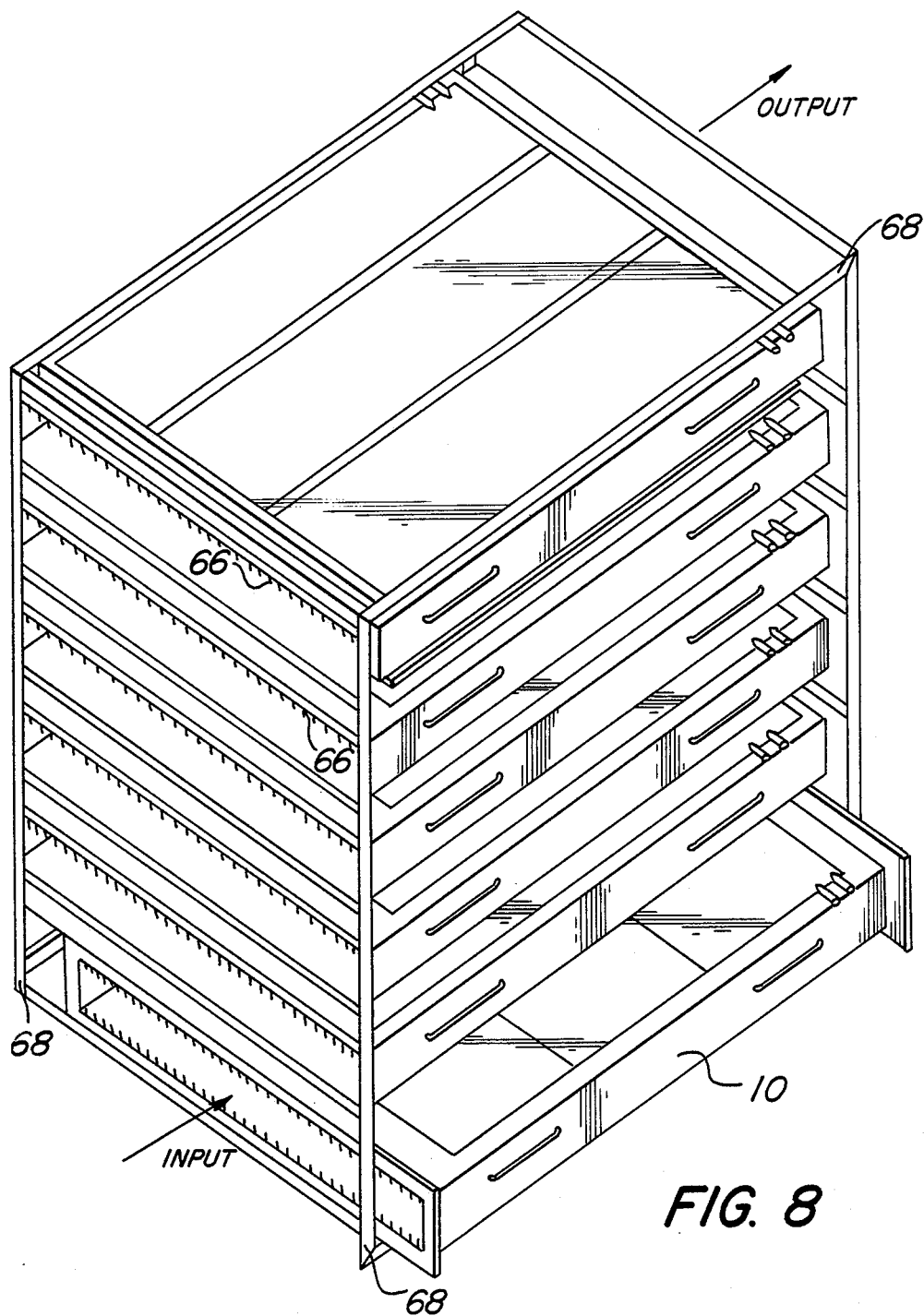

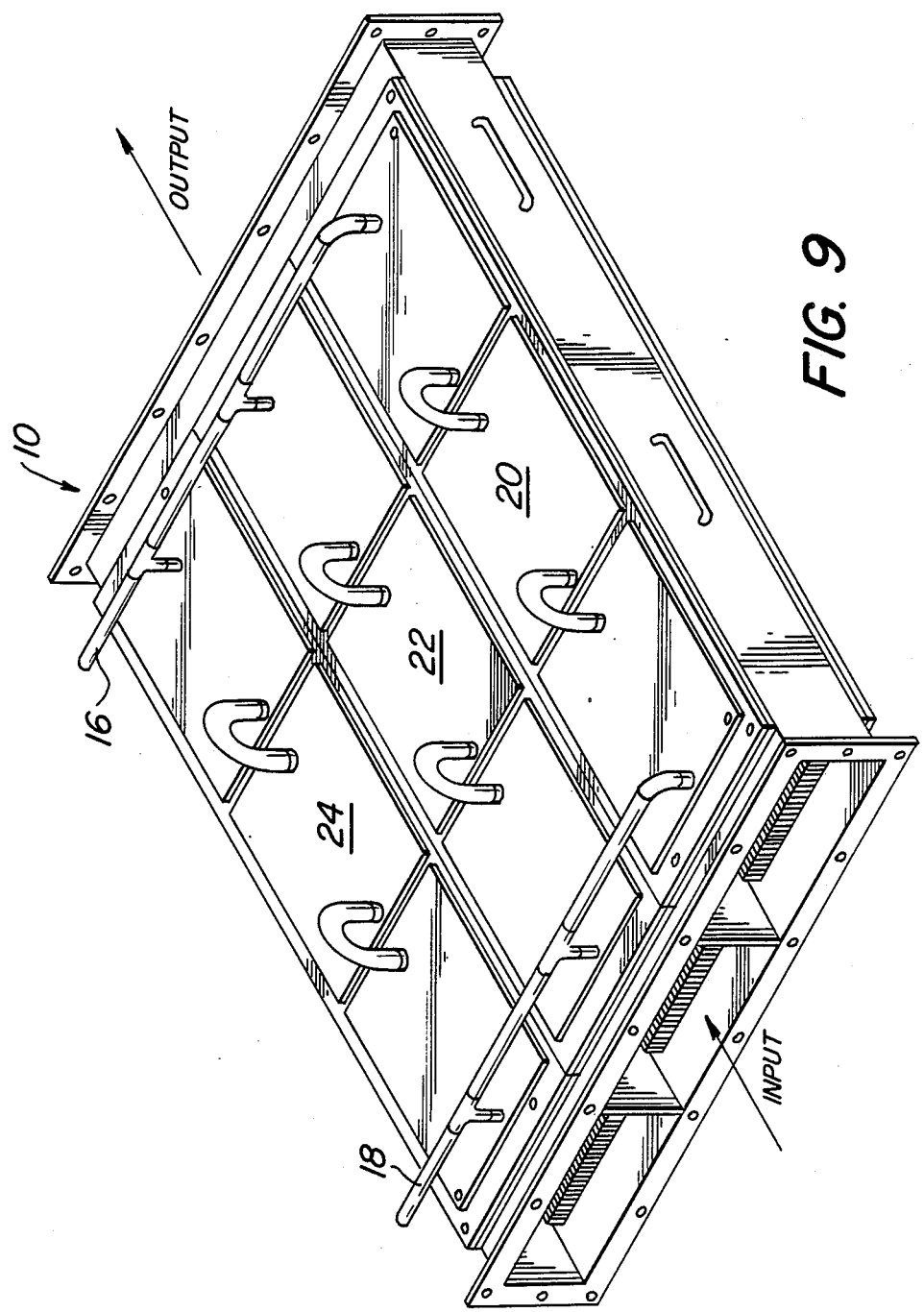

THERMOELECTRIC GENERATOR

BRIEF SUMMARY OF THE INVENTION

This invention relates to the utilization of waste heat through thermoelectric conversion to create DC electrical power. This invention further relates to large kilowatt power generation by the combination of thermoelectric modular elements. Different ranges of power output may be produced by utilizng multiple combinations of the modular elements of this invention.

BACKGROUND OF THE INVENTION

The concept of large kilowatt thermoelectric power generation is economically desirable since it utilizes waste heat and converts it into useful electrical power. Large amounts of low grade thermal energy may be economically converted into electric power through the use of solid state semiconductor devices. Thermoelectric energy conversion is based on the Seebeck effect which occurs in the semiconductor material subjected to a thermal gradient. Electrons in the material move in the direction of the heat flow and create a voltage potential between the hot and cold ends of the material. If the hot and cold ends are connected to complete an electrical circuit the power produced may be utilized in industrial applications. This thermoelectric phenomenon is most commonly found in thermocouples which are used, e.g., in automatic thermostats for cooking ovens, for automobile engine coolant temperature indicators or for solenoid pilot valve operated gas furnaces.

The basic advantage of the thermoelectric generator contemplated by this invention is a direct consequence of its solid state construction. The electric energy is created without rotary or moving machinery and thus the power may be produced over an extended period of time and at an extremely reduced cost due to limited wear and maintenance. By utilizing a modular configuration, generators having various power output ranges may be assembled utilizing similar elements. By employing mass production techniques for the modular structures the generation of thermoelectric energy becomes economically feasible.

An additional advantage of thermoelectric power generation relates to the use of cooling water as a heat sink. Many potential industrial users of thermoelectric power generators often require large amounts of hot water for boiler feed. Water cooled thermoelectric generator systems can decrease the energy required to supply this process hot water by performing as a feed water preheater.

Another advantage of thermoelectric generators is the extraction of waste heat from a process stream and, thereby, exposing the equipment downstream of the generator to lower operational gas temperatures. This reduction in the operation temperature of this equipment increases its useful life and reduces its life cycle costs.

SUMMARY OF THE INVENTION

The preferred embodiment of a single thermoelectric generator module as contemplated by this invention includes two heat exchangers, one being a hot side or heat source exchanger and the opposite being a cold side exchanger or heat sink. The hot side of the thermoelectric generator, is exposed to a hot gas or fluid stream, and is preferably provided with an extruded fin surface. The size of the fins generally increase from the inlet end to the outlet end of the exchanger. The increase in fin size creates a uniform heat flux over a range of decreasing gas temperatures along the length of the exchanger plate. The cold side of the thermoelectric generator module consists of tubular passageways through which a cooling medium (such as water) is run. The production of an electric potential is created by a series of semiconductor modules positioned between and in thermal contact with both the hot and cold side exchangers.

The basic construction of the power producing module consists of a series of junctions of "N" and "P" semiconductor materials which are connected in series electrically and in parallel thermally. Each semiconductor module is thermally coupled on its opposite sides to the heat source and heat sink configuration but is electrically insulated from these exchangers. The semiconductor materials are connected electrically to create a specific output voltage and may be connected in either a series or parallel combination, depending on their output specifications, to produce a desired DC voltage and power output for each generator module.

The geometry of each semiconductor module consists generally of a central portion having two parallel flat surfaces and providing a uniform cross section. Two channels are provided on opposite ends of the central portion for receiving wires which electrically interconnect each semiconductor module. The series of modules are arranged linearly on the side opposite of the fin surface of the hot side exchanger. The heat sink tubular members are placed linearly along each module line. The separation between individual modules and the spacing between rows is determined by the heat flux and temperature difference provided by the opposing heat exchangers.

The efficiency of a theromelectric generator is a function of the material properties of the semiconductor modules and their operating junction temperatures. The bypass heat loss, the electrical losses and the efficiency of the heat source/heat sink exchangers are all variables that effectively control the cost and economic feasibility of a generator design.

By defining a modular structure of the generator, the semiconductor units, the heat exchanger plates, the heat sink ductwork and the heat exchanger fins, mass production techniques may be utilized so that the production cost of a single thermoelectric generator unit is substantially reduced. Additionally by designing generator modules that have an effective one kilowatt power output and combining these generator modules, varying power outputs may be obtained by connecting this modular structure in electrical series or parallel combinations. The power and voltage output of a generator is dependent on the grouping of the semiconductor modules and the generator units as desired by the user of the invention.

Further advantages will become apparent to those skilled in the art by particularly pointing out and describing the preferred embodiment of this invention. However, for the purposes of illustrating the invention, there is shown in the drawings a number of forms which are presently contemplated; it being understood that this invention is not limited to the precise arrangements and instrumentalities shown.

BRIEF DESCRIPTION OF THE DRAWINGS

FIG. 1 shows the preferred embodiment of the generator of this invention.

FIG. 2 shows a partial view of a heat sink exchanger module of the generator of FIG. 1.

FIG. 3 shows a partial cross sectional view of an individual generator unit showing the inter-relation between the heat source and the heat sink exchangers and the semiconductor modules.

FIG. 4 shows a layout of the semiconductor modules for a typical one kilowatt unit.

FIG. 5 shows an alternate embodiment of a heat sink exchanger plate of the invention.

FIG. 7 shows a third embodiment of a heat sink exchanger.

FIG. 8 shows a combination of thermoelectric generator modules for an increase in power output.

FIG. 9 shows perspective view of one generator unit which is a portion of the generator shown in FIG. 8.

FIG. 10 is a cross sectional view of an alternate embodiment of a cold side heat exchanger.

DETAILED DESCRIPTION OF THE INVENTION

Figure 6B:
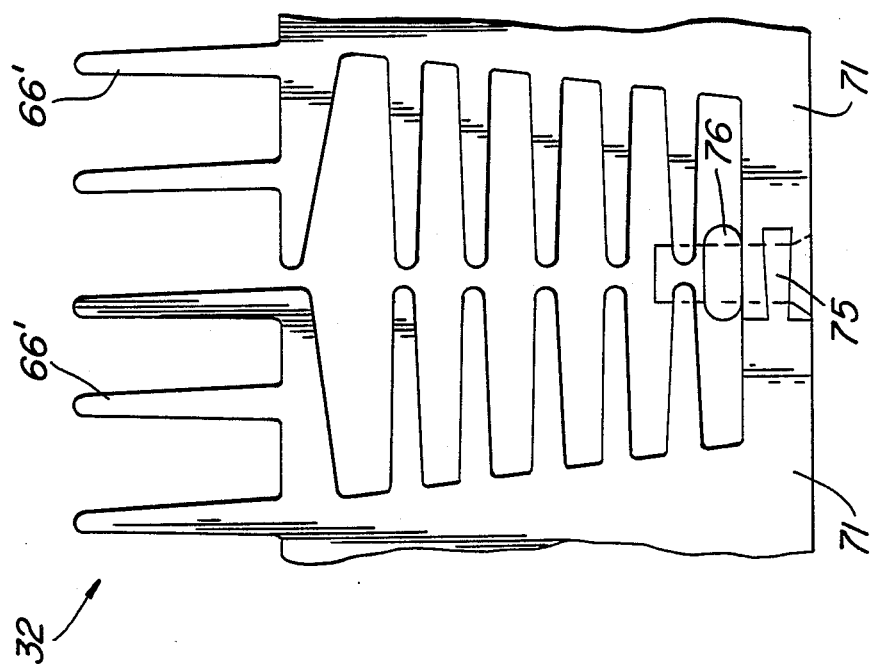
FIGS. 6 A and 6B show an alternate embodiment of a heat source exchanger.

In FIG. 1 the thermoelectric generator of this invention is generally shown by the reference numeral 10. An inlet duct 12 feeds hot gases into the thermoelectric generator 10 and an outlet duct 14 receives the exhaust of gases after passage through the generator 10. A coolant supply is provided to both sides of the generator 10 by a series of input pipes 16 which provide the coolant at the gas outlet end of the generator 10. The coolant is exhausted at the opposite or gas inlet end of the generator 10 through output pipes 18.

It should be noted that the embodiment of the thermoelectric generator of FIG. 1 consists generally of a series of generator modules 20, 22, and 24, which are positioned in an opposing relationship with a second series of modules 26, 28 and 30 (not shown) on opposite side of the generator 10. This particular combination of modules is designed to produce a power output of up to 5 kilowatts, however, almost any power output may be achieved by appropriate combination of modules. In FIG. 2 a portion of the cold side or heat sink exchanger of a single thermoelectric module 20 is shown, it being understood that the other generator modules 22, 24, 26, 28 and 30 are of similar construction.

Each generator module, as shown in FIG. 3, consists generally of a hot side or heat source exchanger 32, a cold side or heat sink exchanger 34 and a series of semiconductor modules 36. The semiconductor modules 36 are positioned between the two heat exchangers 32 and 34 and are aligned in a linear fashion. The separation between each semiconductor module 36 contemplates the effective heat exchanger rate of the hot and cold side exchangers so as to produce a desired thermal flux through the semiconductor modules 36. This thermal flux will depend primarily on the internal properties of the semiconductor modules 36. As shown in FIGS. 2 and 3, the cold side exchanger 34 generally consists of a series of tubular members 38, 40 and 42 which are positioned linearly along the length of the generator module 20 directly adjacent to the line of the semiconductor modules 36 (see also FIG. 4).

As can be seen in FIG. 3 the tubular members 38-42 of the cold side exchanger 34 have a generally rectangular cross section. The actual shape of tubular members 38-42, however, is not restricted to this particular cross section. Proper thermal contact between the duct 38 and the semiconductor modules 36 requires only an engaging flat surface 37 such that a minimum of thermal contact resistance occurs between the module 36 and the cold side exchanger 34. The tubular members 38-42 may be provided at their opposite linear ends with an entry port 44 and exhaust port 46 which is tapped to receive a pipe fitting (not shown) and to receive the coolant input pipes 16 or output pipes 18 respectively.

The area between individuals semiconductor modules 36 on the rear surface of the hot side exchanger 32 is covered by an insulation material 48 such that the heat flow from the heat source 32 is directed substantially through the semiconductor modules 36. This insulation material 48 is preferably a semi-rigid high temperature insulation board which is pre-cut to surround the semiconductor module 36 pattern on the hot side heat exchanger 32.

The semiconductor modules 36 are each positioned on the hot side exchanger 32 and joined thermally through means of a thermal conducting grease on surface 50 which is provided to increase the thermal contact between the hot side of the semiconductor module 36 and the heat source 32. Similarly, a thermal grease may be provided on surface 37 adjacent to the cold side of the semiconductor module 36.

An electrical insulation material may also be provided between the modules 36 and the exchangers 32, 34 adjacent to surface 50 and 37, respectively. The preferred material for the electrical insulation is either a polyether-ether-ketone, or PEEK, material or an aluminum oxide ($AL_2O_3$). This insulation material must have a high dielectric strength even when provided in a thin layer, such as 0.001 inches thick. The thinner the electrical insulation material the lower the temperature drop across the material and therefore the greater the temperature differential seen by the semiconductor modules 36. The PEEK or aluminum oxide material meets the high tensile strength requirements so that breakage and electrical shorts are substantially avoided.

Figure 11:
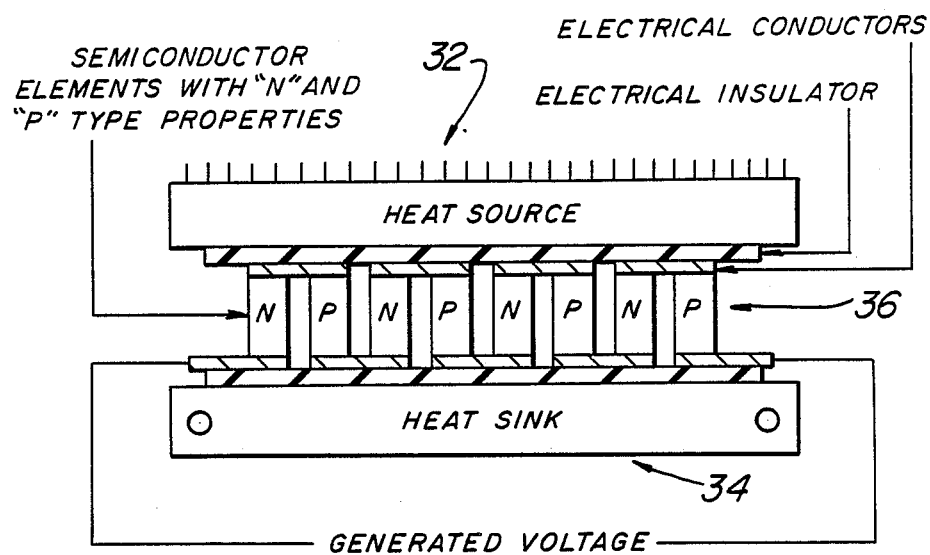
FIG. 11 is a cross sectional view of a semiconductor module and its relative electrical connections.

The basic construction of the semiconductor module 36 is shown in cross section in FIG. 11. The semiconductor module 36 includes a series of "N" and "P" type semiconductor materials which are connected in series electrically and parallel thermally. Each of the modules 36 are thermally coupled on its opposite sides to the heat source 32 and heat sink 34 exchangers but are electrically insulated from these components by the electrical insulation material (PEEK or $AL_2O_3$). The semiconductor module 36 configuration and its associated semiconductor material pattern are connected electrically to create a specific output voltage based upon the temperature differential between the two heat exchangers. The series of modules 36 may then be connected electrically in either a series or parallel combination to produce the desired generator 10 power and voltage outputs.

As can also be seen in FIG. 3 the semiconductor modules 36 are formed with two opposing electrical terminals 54 and 56 which provide electrical connection between the series of semiconductor modules 36 in a generator module 20. A wire 58 electrically connects the electrical terminal 54 of one semiconductor module 36 with the electrical terminal 56 of an adjacent module 36 as shown in FIG. 4.

In the embodiment shown in FIGS. 1-3 the cold side exchanger is primarily constructed of tubular members 38-42. The cold side exchanger 34 may also be made of a plate 70 having attached fluid channels as shown in FIG. 5. The plate 70 performs essentially the same function as the tubular members 38-42. The insulation 48 further serves to separate the electrical wires 58 from the high temperatures of the hot side exchanger 32 and insures that the electrical insulated wires contact the cold side heat exchanger 70.

In FIG. 7 a third embodiment of the cold side exchanger 34 is shown. This embodiment includes the use of a heat pipe 76 which allows the transfer of substantial quantities of heat through a relatively small surface area. The basic configuration of a heat pipe 76 includes a condensable fluid which is contained within a pipe and which vaporizes when heat is added. The vapor moves through the central core of the pipe to its opposite end where heat is removed and the vapor condenses back into a liquid form. The change of state of the working fluid creates a circulation within the heat pipe 76 such that the heat sink surface of the semiconductor modules 36 is continuously cooled without the need for a continuous flow of a coolant fluid.

As can be seen in FIG. 10, the semiconductor modules 36 can be positioned between the tubular members 38 et seq. of the cold side exchanger 34. Additionally, the heat sink 34 may be cooled by forced air or by utilizing a closed refrigerant loop without a compressor such that the fluid phase change absorbs the heat of the generator 10 (FIG. 7).

The assembly of each generator module 20 as seen in FIG. 3 is provided by means of extension bolts 60 which are positioned at various locations on the hot side heat exchanger 32. The bolts 60 extend from the hot side exchanger towards the cold side exchanger 34. Each extension bolt 60 is provided with a clamping member 62 which retains one or more tubular members 38-42, or a portion of the heat sink plate 70, in thermal contact with the modules 36. Clamping members 62 are provided with a spring 64 or other compensation means whereby thermal expansion or contraction of the various elements will not effect the thermal contact between the modules and the exchangers or cause undue stress or structural failure.

The hot side exchanger 32 as shown in FIG. 3 consists of a series of fins 66 which are provided linearly along the flow through the thermoelectric generator 10. In this embodiment the fins 66 are attached by means of a retaining post 72 which may be extruded from the front surface of the hot side exchanger 32. Between the posts 72 is inserted a fin 66 which contacts the exchanger plate 71 on its bottom surface. A grease joint is provided between the fins 66 and the plate 71 to increase thermal exchange between the two elements. In order to retain the fins in thermal contact with the exchanger plate 71 a rod 74 is inserted adjacent to the retaining post 72 and the fin 66. A tight fit is required between the retaining posts 72, the retaining rod 74, and the fins 66 in order that the bottom surface of the fins 66 is in proper thermal contact with the exchanger plate 71. Each fin 66 is shown attached by means of two retaining posts and two retaining rods. However, a group of three or four fins may be integrally combined and placed in contact with the hot side heat exchanger 32 by means of rods and posts on opposite ends of the grouping of fins 66.

Figure 6A:
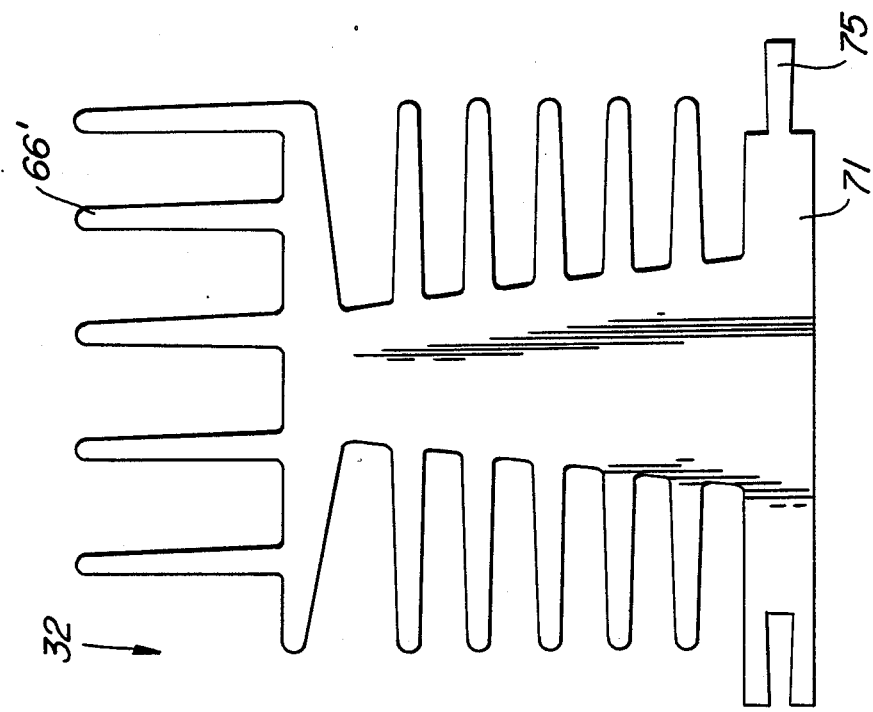

In FIG. 6A and 6B, an alternate embodiment of the hot side heat exchanger 32 is shown. These fins 66' are extruded with the plate and are made of aluminum or some other high thermal conductivity material which, in the configuration shown, has a high heat transfer coefficient with the gases flowing through the generator 10. The purpose of extruding the fins with the exchanger plate is to eliminate the thermal contact resistance joint between the fins 66' and the exchanger plate 71 so as to increase the operating temperature for the hot side exchanger seen by the modules 36. As shown in FIG. 6A, the fins 66' and integral base plate 71 may also be extruded such that an interlocking mechanism 75 is provided for joining the adjacent fins 66'. As seen in FIG. 6B, a fastener 76, such as a self-locking type or through threaded type, may also be used to secure adjacent fins into a single unit which is then integrally connected. The extension bolts 60 may also be utilized to create this integral fin unit. The fins 66' generally increase in height towards the outlet end of the generator 10. By increasing the height of the fins 66' a uniform amount of heat is absorbed over the range of decreasing gas temperatures. This structure substantially produces a uniform heat flow into each of the module 36 along the length of the generator module 20.

Each thermoelectric module is positioned opposing another module on either side of the generator 10. This formation generally creates an enclosed chamber which connects the inlet duct 12 to the outlet duct 14. As can be seen in FIG. 8 a series of the generator modules 10 may, also, be arranged on a frame 68 such that a large cross sectional area of heat source exchanger is provided. Thus an increase in heat flow from the source fluid can be utilized to increase the power generation of the unit by connecting a number of modules electrically to combine their total output.

As will be understood by those skilled in the art the thermoelectric generation can be increased from 1 kilowatt to, generally, a 30 kilowatt flow (FIG. 8) by providing a sufficient hot side and cold side temperature differential for creation of electrical power by the semiconductor modules 36.

The present invention may be embodied in other specific forms without departing from the spirit or essential attributes thereof and, accordingly, reference should be made to the appended claims, rather than to the foregoing specification, as indicating the scope of the invention.

I claim:

1. A thermoelectric generator unit comprising: a hot side heat exchanger including a plate having extruded retention posts projecting from one surface of said plate, a plurality of fins adapted for contact with a heating source, said fins positioned between two of said retention posts, a plurality of retention rods adapted to be inserted between said retention posts and the base of said fins to retain said fin in thermal contact with said plate surface upon insertion of said retention rod between said engaging surface of said post and said corresponding fin; a plurality of thermoelectric semi-conductor modules in thermal contact with the opposite side of the hot side heat exchanger plate from said contact with said fins, said modules arranged in a grid pattern so that heat flow is directed into each of said modules from said hot side heat exchanger, said modules being connected electrically so as to combine their electrical output; and a cold side heat exchanger in thermal contact with said plurality of modules acting as a heat sink on the opposite side of said module from said hot side heat exchanger plate so as to produce a thermal gradient across said modules.

2. A thermoelectric generator unit as claimed in claim 1 wherein said cold side heat exchanger further comprises a tubular member having a thermal contact surface positioned adjacent to said modules, said tubular member having an inlet and an outlet at opposite ends thereof, said member defining a channel adapted for passage of a cooling medium and positioned along a row in the module grid pattern.

3. A thermoelectric generator unit as claimed in claim 1 wherein said cold side heat exchanger further comprises a plate having attached tubular members, said plate being in thermal contact with said modules, said tubular members having an inlet and an outlet and through which is passed a cooling medium.

4. A thermoelectric generator unit as claimed in claim 1 wherein said cold side heat exchanger is a heat pipe.

5. A thermoelectric generator unit as claimed in claim 1 further comprising a heat conductive grease between said fin and said plate surface.

6. A thermoelectric generator unit as claimed in claim 1 wherein a heat conductive grease is provided between said plate and said modules.

7. A thermoelectric generator unit as claimed in claim 1 further comprising an electric insulation material provided between said plate and said modules.

8. A thermoelectric generator unit as claimed in claim 7 wherein said insulation material is a poly-ether-etherkeytone material.

9. A thermoelectric generator unit as claimed in claim 7 wherein said insulation material is an aluminumoxide material.

10. A thermoelectric generator unit as claimed in claim 1 including a heat insulation material on the portion of the surface of said hot side exchanger plate which surrounds the area on the surface which is said modules.

11. A thermoelectric generator unit as claimed in claim 1 wherein said cold side heat exchanger is adapted to be cooled by forced air over the surface of said cold side exchanger.

12. A thermoelectric generator unit as claimed in claim 1 wherein said cold side heat exchanger comprises a closed refrigerant loop without a compressor.

13. A thermoelectric generator unit as comprising: a hot side heat exchanger having a plurality of fin assemblies, each said assembly having a base member and at least one fin member extruded from the base member, each said base member having means adapted for interlocking with a second base member and fin assembly, such that said base members of said fin assemblies are positioned adjacent one another so as to form an integral exchanger plate having fins on one surface thereof; a plurality of thermoelectric semi-conductor modules in thermal conduct with the opposite side of said integral exchanger plate from said fin members, said modules arranged in a grid pattern so that heat flow is directed into each said module, said modules being connected electrically so as to combine their electrical output; and a cold side heat exchanger in thermal contact with said plurality of modules acting as a heat sink on the opposite side of said modules from said integral exchanger plate so as to produce a thermal gradient across said modules.

14. A thermoelectric generator unit as claimed in claim 13 further comprising: a plurality of fasteners extending through said integral exchanger plate at the interlocking means joining said fin assemblies, said fasteners securing adjacent fin assemblies so as to form the single unit of the integral exchanger plate.

* * * * *